(12) United States Patent
Doris et al.

(10) Patent No.: US 8,318,574 B2
(45) Date of Patent: Nov. 27, 2012

(54) SOI TRENCH DRAM STRUCTURE WITH BACKSIDE STRAP

(75) Inventors: Bruce B. Doris, Brewster, NY (US); Kangguo Cheng, Guilderland, NY (US); Ali Khakifirooz, Slingerlands, NY (US); Pranita Kulkarni, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 12/847,208

(22) Filed: Jul. 30, 2010

(65) Prior Publication Data

US 2012/0025288 A1 Feb. 2, 2012

(51) Int. Cl.
*H01L 21/20* (2006.01)

(52) U.S. Cl. .................................................. 438/386

(58) Field of Classification Search .................. 257/301, 257/E27.084, E27.112, E21.008, E21.646; 438/386, 151, 243, 388, 389, 391
See application file for complete search history.

(56) References Cited

U.S. PATENT DOCUMENTS

| 5,670,805 | A | 9/1997 | Hammerl et al. | 257/301 |
|---|---|---|---|---|
| 5,827,765 | A | 10/1998 | Stengl et al. | 438/243 |
| 5,923,971 | A | 7/1999 | Ho et al. | 438/245 |
| 6,063,657 | A | 5/2000 | Bronner et al. | 438/244 |
| 6,635,525 | B1 | 10/2003 | Mandelman et al. | 438/243 |
| 2008/0083941 | A1* | 4/2008 | Cheng et al. | 257/301 |
| 2009/0001592 | A1 | 1/2009 | Barth et al. | 257/770 |
| 2009/0108314 | A1 | 4/2009 | Cai et al. | 257/301 |

OTHER PUBLICATIONS

"Advanced Low Temperature Raised S/D Epitaxy Using Cyclic and Poly-Selective Techniques", Loubert et al, (2 pages), Dec. 15, 2009.
"IBM Gains Confidence in 22 nm ETSOI" http://english.ime.cas.cn/ns/es/200912/t20091216_49391.html, (3 pages), Jul. 30, 2010.

* cited by examiner

*Primary Examiner* — A. Sefer
*Assistant Examiner* — Nikolay Yushin
(74) *Attorney, Agent, or Firm* — Harrington & Smith (57) ABSTRACT

In one exemplary embodiment, a semiconductor structure including: a SOI substrate having of a top silicon layer overlying an insulation layer, the insulation layer overlies a bottom silicon layer; a capacitor disposed at least partially in the insulation layer; a device disposed at least partially on the top silicon layer, where the device is coupled to a doped portion of the top silicon layer; a backside strap of first epitaxially-deposited material, at least a first portion of the backside strap underlies the doped portion of the top silicon layer, the backside strap is coupled to the doped portion of the top silicon layer at a first end of the backside strap and to the capacitor at a second end of the backside strap; and second epitaxially-deposited material that at least partially overlies the doped portion of the top silicon layer, the second epitaxially-deposited material further at least partially overlies the first portion.

19 Claims, 9 Drawing Sheets

Forming a semiconductor structure comprising a silicon-on-insulator substrate, a capacitor and at least one device, where the silicon-on-insulator substrate is comprised of a top silicon layer overlying an insulation layer and a bottom silicon layer underlying the insulation layer, where the capacitor is disposed at least partially in the insulation layer, where a target device of the at least one device is disposed at least partially on the top silicon layer and is coupled to a doped portion of the top silicon layer, where the target device is not electrically coupled to the capacitor —701

Thereafter, forming a backside strap comprised of first epitaxially-deposited material, where at least a first portion of the backside strap underlies the doped portion of the top silicon layer, where the backside strap is coupled to the doped portion of the top silicon layer at a first end of the backside strap and to the capacitor at a second end of the backside strap, where the backside strap electrically couples the target device to the capacitor via the doped portion os the top silicon layer —702

SOI TRENCH DRAM STRUCTURE WITH BACKSIDE STRAP

TECHNICAL FIELD

The exemplary embodiments of this invention relate generally to semiconductor structures and, more specifically, relate to SOI trench structures.

BACKGROUND

Dynamic random-access memory (DRAM) cells are comprised of two main components: a storage capacitor (which stores charge) and an access transistor (which transfers charge to and from the capacitor). The capacitor may be either planar (on the surface) or trench (etched into the semiconductor substrate). In the semiconductor industry where there are increased demands for memory storage capacity and decreased chip size, the trench capacitor layout is favored over the planar capacitor design because this particular setup results in a dramatic reduction in the space required for the capacitor without sacrificing capacitance.

One very important and extremely delicate element in the DRAM cell is the electrical connection made between the storage trench and the access transistor. Such a contact is often referred to in the art as a self-aligned conductive strap. This strap (which may be on the surface or may be buried) is formed at the intersection of the storage trench and the junction of the array device by dopants which, through a thermal processing step, are outdiffused from the highly doped polysilicon fill (located in the storage trench) into the substrate (from which the trench was cut).

BRIEF SUMMARY

In one exemplary embodiment of the invention, a semiconductor structure comprising: a silicon-on-insulator substrate comprised of a top silicon layer overlying an insulation layer, where the insulation layer overlies a bottom silicon layer; a capacitor disposed at least partially in the insulation layer; a device disposed at least partially on the top silicon layer, where the device is coupled to a doped portion of the top silicon layer; a backside strap comprised of first epitaxially-deposited material, where at least a first portion of the backside strap underlies the doped portion of the top silicon layer, where the backside strap is coupled to the doped portion of the top silicon layer at a first end of the backside strap and to the capacitor at a second end of the backside strap; and second epitaxially-deposited material that at least partially overlies the doped portion of the top silicon layer, where the second epitaxially-deposited material further at least partially overlies the first portion of the backside strap.

In another exemplary embodiment of the invention, a method comprising: providing a silicon-on-insulator substrate comprised of a top silicon layer overlying an insulation layer, where the insulation layer overlies a bottom silicon layer, where the silicon-on-insulator substrate includes a trench that extends through the top silicon layer and at least partially into the insulation layer, where the trench includes a trench wall and exposes a contact of a capacitor disposed at least partially in the insulation layer; forming at least one spacer in the trench against the trench wall; removing a portion of the at least one spacer to expose a portion of the insulation layer in the trench, where the removed portion of the at least one spacer is less than all of the at least one spacer; forming at least one device disposed at least partially on the top silicon layer, where forming the at least one device comprises doping a portion of the top silicon layer; performing an etch to remove a portion of the insulation layer and create an undercut in the insulation layer, where the undercut underlies the doped portion of the top silicon layer and abuts the contact of the capacitor; and epitaxially depositing first and second materials, where the first epitaxially-deposited material at least partially fills the undercut and electrically couples the contact of the capacitor to the doped portion of the top silicon layer, where the second epitaxially-deposited material at least partially overlies the top silicon layer and at least partially overlies the first epitaxially-deposited material.

In a further exemplary embodiment of the invention, a method comprising: forming a semiconductor structure comprising a silicon-on-insulator substrate, a capacitor and at least one device, where the silicon-on-insulator substrate is comprised of a top silicon layer overlying an insulation layer and a bottom silicon layer underlying the insulation layer, where the capacitor is disposed at least partially in the insulation layer, where a target device of the at least one device is disposed at least partially on the top silicon layer and is coupled to a doped portion of the top silicon layer, where the target device is not electrically coupled to the capacitor; and thereafter, forming a backside strap comprised of first epitaxially-deposited material, where at least a first portion of the backside strap underlies the doped portion of the top silicon layer, where the backside strap is coupled to the doped portion of the top silicon layer at a first end of the backside strap and to the capacitor at a second end of the backside strap, where the backside strap electrically couples the target device to the capacitor via the doped portion of the top silicon layer.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein.

DETAILED DESCRIPTION

Figure 1:
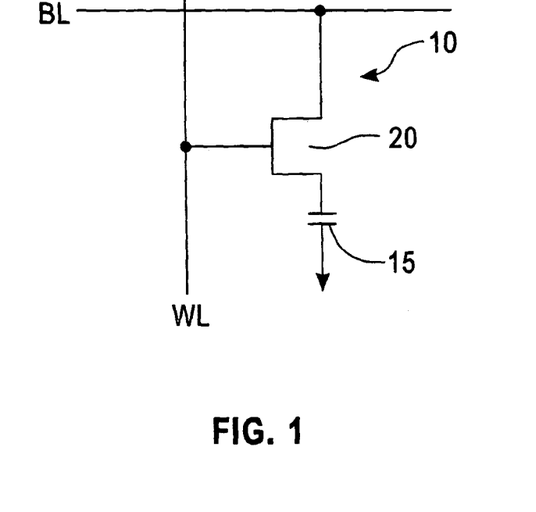
FIG. 1 is a circuit diagram of a memory cell used in a dynamic random access memory (DRAM)

FIG. 1 is a circuit diagram of a memory cell 10 used in a dynamic random access memory (DRAM). Memory cell 10 includes a storage capacitor 15 for storing charges and a metal-oxide semiconductor (MOS) transfer transistor (or "transfer gate") 20 for controlling charge transfer. One end of the source-drain path of MOS transistor 20 is connected to bit line BL and the other end of the source-drain path of MOS transistor 20 is connected to a first electrode of capacitor 15. A second electrode of capacitor 15 is connected to a predetermined potential such as ground potential. The gate of MOS transistor 20 is connected to word line WL to which signals are applied for controlling the transfer of charges between storage capacitor 15 and bit line BL, thereby reading and writing data.

While it is desirable to increase the integration density of memory cells on a memory chip by making the MOS transfer transistor and the storage capacitor smaller, the capacitor must nonetheless be large enough to store sufficient charge for ensuring that data is correctly read from and written to the memory cell. So-called trench capacitors have been developed to increase the capacitance of the storage capacitor while permitting the integration density of the memory cells to be increased.

Figure 2A:
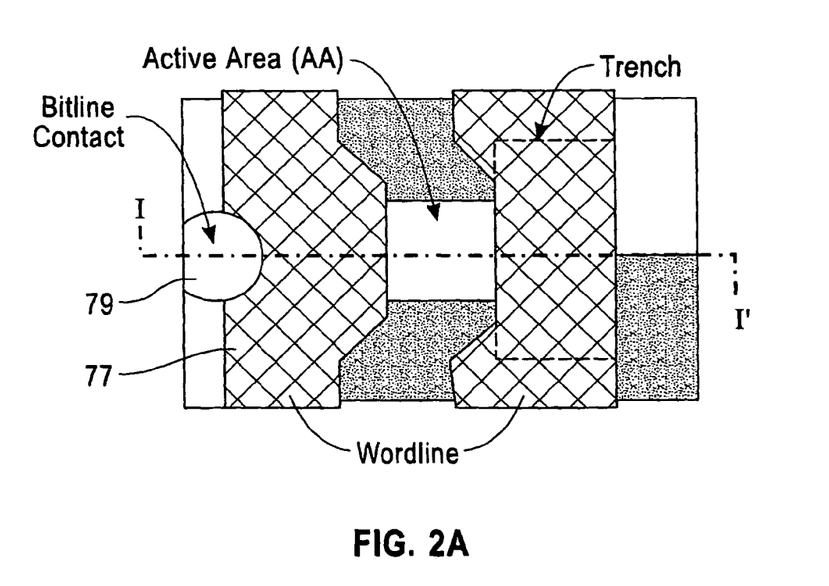
FIG. 2A illustrates a top-down view of a DRAM cell having a self-aligned buried strap.
Figure 2B:
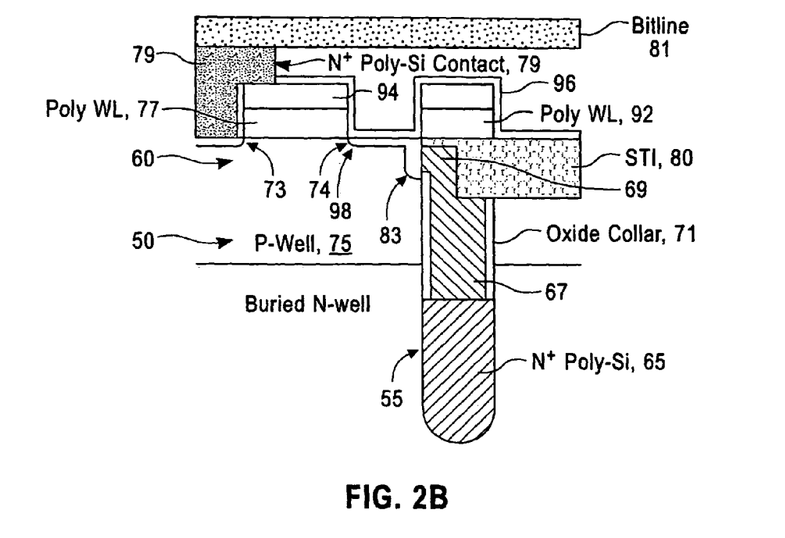
FIG. 2B is a cross-sectional view taken along line I-I' of FIG. 2A.

Various techniques have been employed to connect trench capacitors to surface-located transfer gates. For example, a self-aligned buried strap may be used. FIGS. 2A and 2B illustrate an example of a DRAM cell with a buried strap. Specifically, FIG. 2A illustrates a top-down view of a DRAM cell having a self-aligned buried strap and FIG. 2B is a cross-sectional view taken along line I-P of FIG. 2A. DRAM cell 50 includes a trench capacitor 55 and a transfer gate 60. Trench capacitor 55 includes a first N+ polysilicon fill 65, a second N+ polysilicon fill 67, and a collar oxide 71. While the lower level of the trench 65 is typically filled with an N-doped polysilicon material which is isolated from the P-doped substrate by an insulating node dielectric barrier, the trench may be filled with a P-doped polysilicon material, should P-doping be required.

Transfer gate 60 includes N-type source/drain regions 73 and 74 formed in a P-well 75 and a polysilicon gate 77 insulatively spaced from the channel between source/drain regions 73 and 74. A bit line contact 79 electrically connects source/drain region 73 to bit line 81. A shallow trench isolation (STI) arrangement 80 electrically isolates DRAM cell 50 from an adjacent memory cell and passing word line 92. A diffusion region 83 is formed to electrically connect third polysilicon fill 69 and source/drain region 74 of MOS transfer gate 60 by outdiffusing dopants from the highly doped polysilicon fill in the storage trench into the P-well 75. Diffusion region 83 and third polysilicon fill 69 constitute a buried strap 98 for connecting trench capacitor 55 to transfer gate 60. It has been found that this strap 98 should be as small as possible. For example, the strap 98 may protrude less than 0.1 µm laterally into the P-doped well 75 and vertically no more than the thickness of the STI 80 which isolates this cell from adjacent cells. The capacitor's opposite plate is formed by an N+ region outdiffused from the deep trench sidewalls.

The bit line 81 runs horizontally connecting the cell's bit line contact 79 to other cells' bit line contacts. One of the DRAM's word lines 94 forms the pass gate 77 to an adjacent cell. A second array word line 96 runs vertically, passing over the trench capacitor and partially over the STI 80, forming pass gates for other adjacent cells.

Typically, the strap 98 that connects the storage plate to the pass gate 77 in a DRAM cell is formed in a conventional thermal process which allows the N(or P)-type dopants present in the trench to diffuse upwards through the storage plate (e.g., which is undoped and made of polysilicon) and into the P-doped well 75 through a narrow opening. The dopants cannot diffuse through the node dielectric or oxide collar 71. The object of the process is to limit the size of this outdiffused buried strap region by impeding the flow of N-type dopants into the P-type well region.

One example of a method for forming such a DRAM uses a simple polysilicon strap which connects the collar at the top of the capacitor to the pass transistor of the cell, and is formed from a blanket deposition of strap material which is subsequently removed from top surfaces by further etching processes. In such a case, the strap is formed without the need for an additional mask, commonly practiced in the art, by using a step of forming a STI to define the strap.

As another example, other techniques may involve the deposition of a conductive layer (e.g., doped polysilicon) which is later formed into a strap. The complete process involves the formation of a trench capacitor in a silicon substrate, followed by the deposition of a layer of doped polysilicon or other conductive material over the substrate. The polysilicon layer is then selectively removed from parts of the substrate and a second, more shallow, trench is then etched into the substrate. This second trench is then filled with oxide, and pass gates are made on the substrate according to well known procedures familiar to those practicing the art. To complete the processing, the pass transistors are then strapped to the trench capacitors with the remaining portions of the doped polysilicon layer.

However, several difficulties are associated with the buried strap concept. A first difficulty is that after the buried strap is formed, the thermal budget of the further semiconductor device fabrication process is limited. This means, quite simply, that once the strap has been formed, the system can only tolerate limited exposure to elevated temperatures during further processing. Exceeding this limit leads to an excessive outdiffusion from the trench polysilicon fill to underneath the transfer gate and towards neighboring memory cells. This dopant outdiffusion results in unacceptable changes of the transfer gate device characteristics as well as in possible electrical leakage between neighboring cells. With the shrinking design groundrule of high capacity DRAMs, the tolerable length of this outdiffusion also decreases.

Further, the limitation on the thermal budget after buried strap formation limits oxidation steps to low temperature and conflicts with the need for thermal anneals to heal implantation damage or to relieve stress built up in the silicon substrate during the fabrication process. During oxidation processes following the buried strap formation, oxygen can diffuse from the substrate surface into the collar oxide and oxidize the sidewalls of the polysilicon trench fill and the substrate. The collar oxide expands and forms a vertical bird's-beak-shape. This collar expansion leads to a high stress level and to generation of extended crystal defects in the substrate like dislocations and stacking faults around the most expanded part of the oxide collar. Extended crystal defects can cause electrical leakage across junctions. If the stress built up during one or several oxidation steps is below the critical level to generate crystal defects, and if there is enough thermal budget to relieve this stress by thermal anneals after the oxidation steps, the formation of extended crystal defects can be prevented. Therefore, a thermal budget which allows proper stress relief anneals is useful for a successful fabrication of a DRAM with the deep trench and buried strap concept.

Another difficulty related to the buried strap concept is the generation of extended crystal defects at the interface of polycrystalline trench fill to the crystalline silicon substrate. This interface sits next to the area where the oxide collar expands most during the oxidation steps of the fabrication process and therefore is exposed to the highest stress field. During the oxidation steps, the polysilicon trench fill contacting the single-crystalline silicon substrate starts to recrystallize in an uncontrolled manner over a distance which can be as far as the width of the collar oxide. Due to the inherent high stress field, crystal defects in the polysilicon grains (e.g., twins, stacking faults, etc.) act as seeds for defect formation at the interface to the neighboring substrate. Crystal defects are generated there and pushed far into the substrate.

Methods have been proposed to lower the thermal budget by performing part of the transistor fabrication prior to formation of the buried strap. For example, the STI may be formed prior to the buried strap. As another example, an undoped semiconductor may be used as the strap, becoming doped through dopant diffusion from the trench electrode. To address the crystal defect formation, an undoped amorphous silicon may be used for the buried strap. This becomes crystallized later and doped by dopant diffusion from the trench electrode.

Another technique utilizes a faceted epitaxy strap from the top of the source/drain (S/D) region to the trench polysilicon to reduce the capacitance associated with the wordline. This method uses an epitaxy condition that forms facets on crystalline silicon but not on polysilicon. The distance between the top of the active layer and the trench polysilicon should be less than the epitaxy thickness. This means that if the thickness of the active layer is more than the intended epitaxy thickness, trench polysilicon will be in contact with the active layer during device processing.

Epitaxy refers to the formation of a layer on a crystalline surface, with the layer having the same symmetry and crystalline orientation as the crystalline surface. Typically, a single crystal lattice structure carries across an interface. Customarily in epitaxy, a single crystal or mono crystalline material forms a platform onto which another single crystal material with matching crystalline characteristics is deposited by one of several techniques known in the art. As non-limiting examples, such techniques include: ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing chemical vapor deposition (LRPCVD), plasma-enhanced chemical vapor deposition (PECVD), and molecular beam epitaxy (MBE).

Another technique uses a thin undoped silicon-on-insulator (SOI) pass transistor for better device scaling and reduced leakage in future technology nodes. However, formation of the strap for such thin SOI devices is a challenge. One way to provide good electrical contact between the pass transistor and the trench capacitor is to contact from the backside of the transistor diffusion region.

It is, therefore, an object of the exemplary embodiments of the present invention to provide an improved method and structure for connecting a transistor (e.g., an access transistor) to a capacitor (e.g., a trench storage capacitor of a DRAM cell). The exemplary embodiments of the invention allow for a higher thermal budget for further processing (e.g., DRAM processing) than prior art methods and enable appropriate stress relief without excessive dopant outdiffusion.

In various exemplary embodiments of the invention, a buried strap structure (e.g., for SOI memory cells) is formed using selective epitaxy of a heavily doped semiconductor on the bottom surface of the transistor diffusion layer and connects the pass transistor to the trench electrode. The epitaxy step is performed at the end of the front end of the line (FEOL) process. Prior to the epitaxy step, the trench electrode is (e.g., completely, entirely, substantially) separated from the pass gate, thus (e.g., completely, entirely, substantially) eliminating dopant diffusion from the trench electrode to the pass transistor. The term selective means that during the epitaxial (epi) deposition there may not be a need for masking because the growth only occurs on the desired surfaces.

Figure 3:
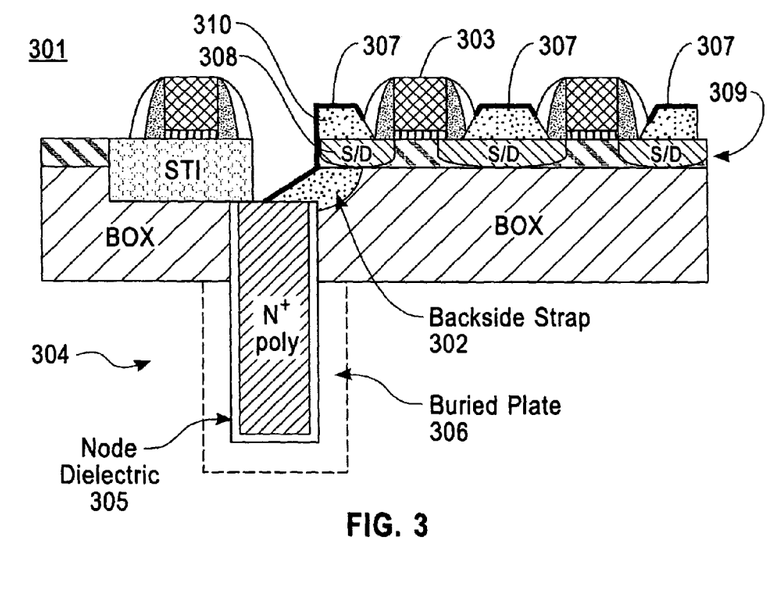
FIG. 3 shows an exemplary device in accordance with the exemplary embodiments of the invention.

FIG. 3 shows an exemplary device 301 in accordance with the exemplary embodiments of the invention. A buried strap 302 connects the backside of the pass transistor 303 to the trench electrode 304. The trench electrode 304 is comprised of a node dielectric 305 surrounded by a buried plate 306. The strap 302 is formed by selective epitaxy growth of an in-situ doped semiconductor, such as Phosphorus or Arsenic doped Si, SiGe, or Si:C, as non-limiting examples. This epitaxy step may be used to form a raised S/D for thin SOI structures or an embedded Si:C stressor for thicker SOI, as non-limiting examples. As such, and by extension, it does not add to the process complexity. In the exemplary embodiment of FIG. 3, the epi layer (including the backside strap 302) mostly grows on single crystalline Si and not on the polysilicon trench electrode 304. In some exemplary embodiments, and as shown in FIG. 3, the buried strap 302 as well as other connectors in the structure may be silicided (i.e., covered with an amount of silicide 307 in order to facilitate the electrical connection by reducing resistance).

It is noted that the top and bottom epitaxy layers (no. 310 and the backside strap 302, respectively) are both heavily doped. The S/D region 308 of the transistor 303 is also heavily doped with the same polarity (e.g., N+) to establish an electrical connection between the transistor 303 and the trench electrode 304 via the backside strap 302. The silicide 307 is optional. In fact, since no metalization is needed on the node between the trench capacitor 304 and the pass transistor 303, the silicide on this node can be skipped if the epitaxy layer meets the resistance requirements.

It is also noted that one terminal of the trench capacitor is the N+ layer within the substrate that is shared and isolated from the transistors by the BOX layer. The other terminal is connected to the corresponding pass transistor for each capacitor and is isolated from neighboring transistors by the STI.

Further, the reason the strap 302 is referred to as a "backside" strap is because in different semiconductor structures (not shown) the connection between the S/D region of the transistor and the trench capacitor is made on the sides of the transistors. When the Si layer is thin (e.g., <10 nm or so), there is not enough room for a low-resistance connection on the side. Thus, another possibility is to use a backside strap that connects the S/D and the trench through the bottom of the S/D region of the transistor. That is, a backside strap is coupled (e.g., electrically) to a bottom of a S/D region of a transistor (i.e., the backside strap is located at least partially below the S/D region, in the BOX layer).

Figure 4:
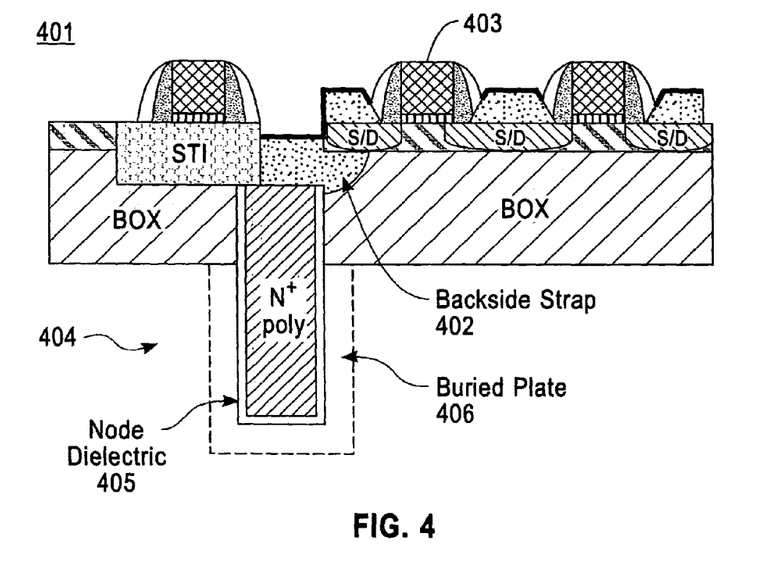
FIG. 4 shows another exemplary device in accordance with the exemplary embodiments of the invention.

FIG. 4 shows another exemplary device 401 in accordance with the exemplary embodiments of the invention. A strap 402 connects the backside of the pass transistor 403 to the trench electrode 404. The trench electrode 404 is comprised of a node dielectric 405 surrounded by a buried plate 406. The strap 402 is formed by selective epitaxy growth of an in-situ doped semiconductor, such as Phosphorus or Arsenic doped Si, SiGe, or Si:C, as non-limiting examples. In this exemplary embodiment, the epi layer (including the backside strap 302) is formed on both the crystalline Si and the polysilicon (e.g., with or at almost, approximately or substantially the same rate).

Figure 5:
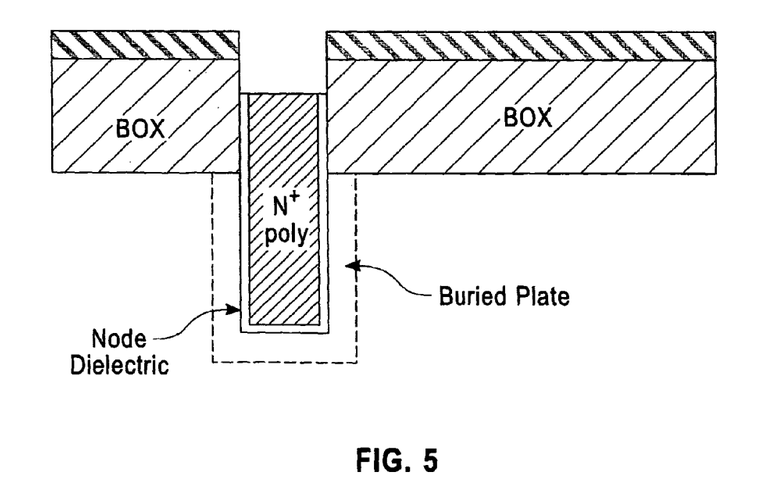
FIGS. 5-11 illustrate exemplary steps of fabricating the exemplary structure shown in FIG. 3.
Figure 6:
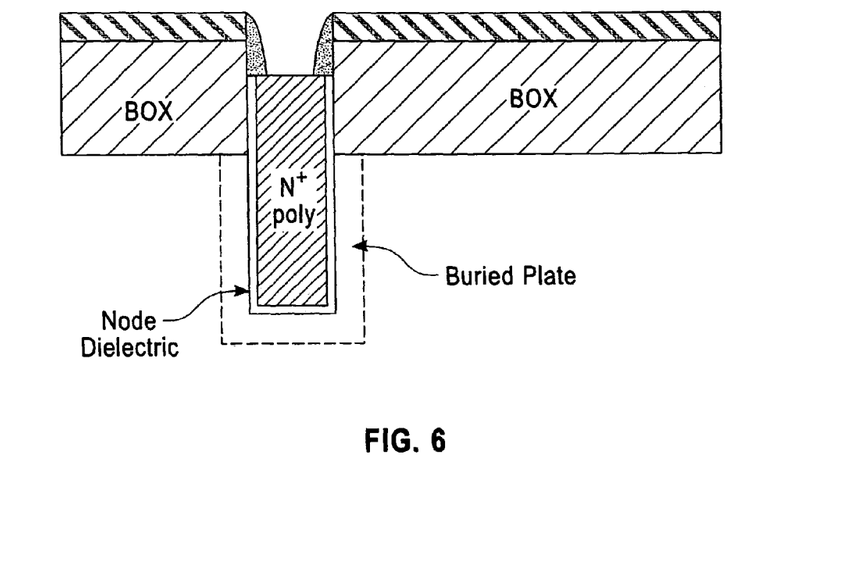
Figure 7:
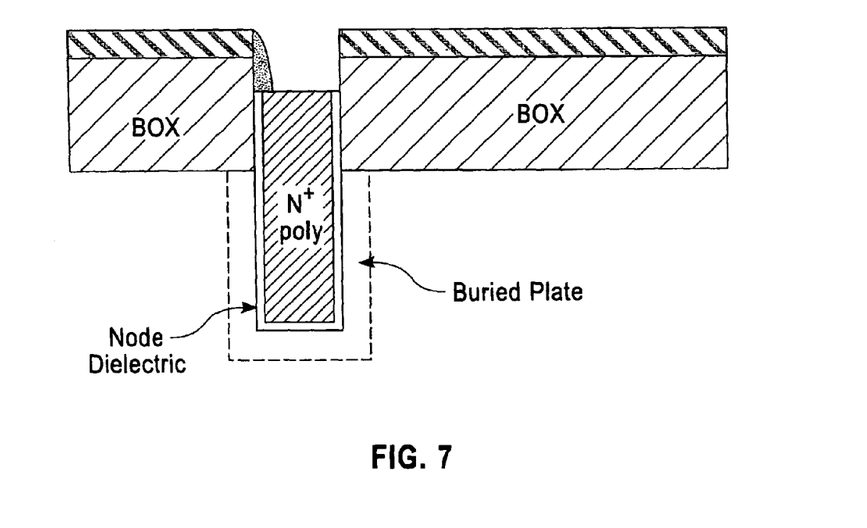
Figure 8:
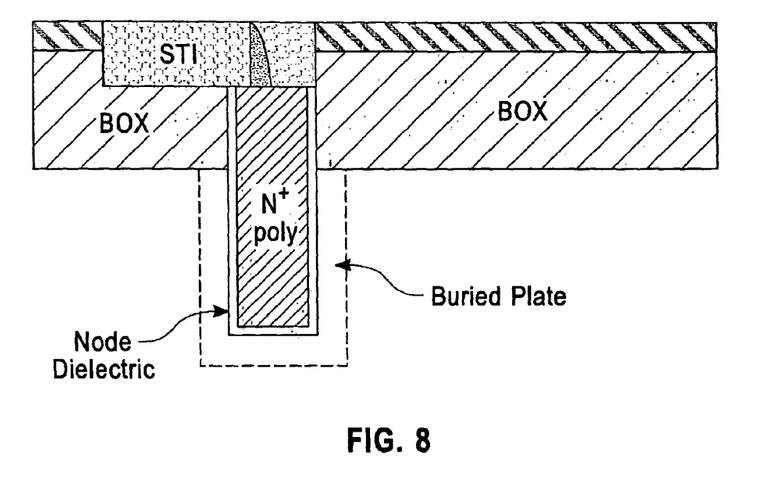
Figure 9:
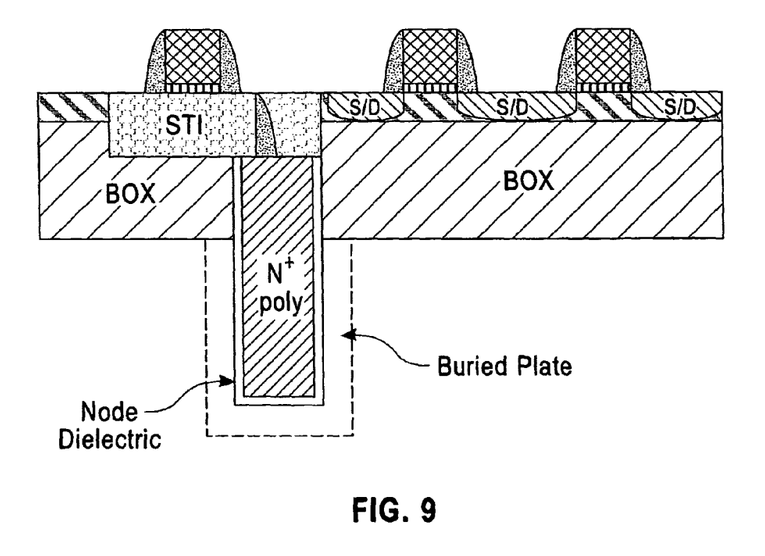
Figure 10:
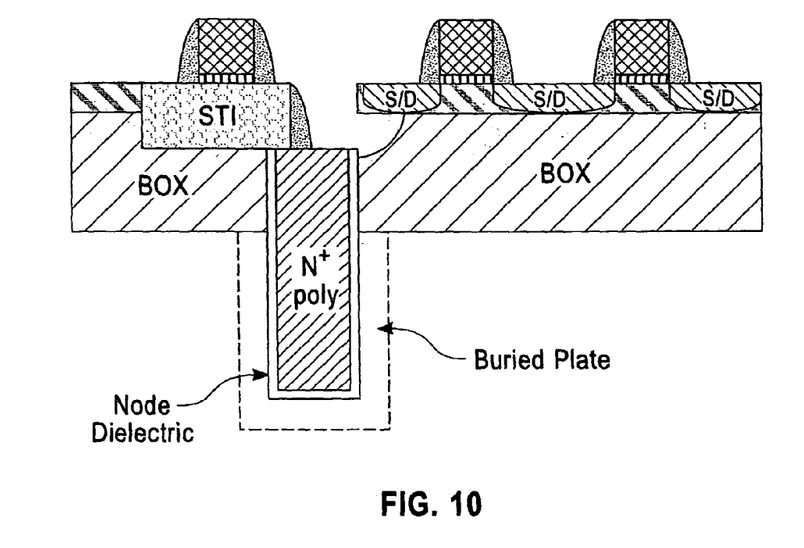
Figure 11:
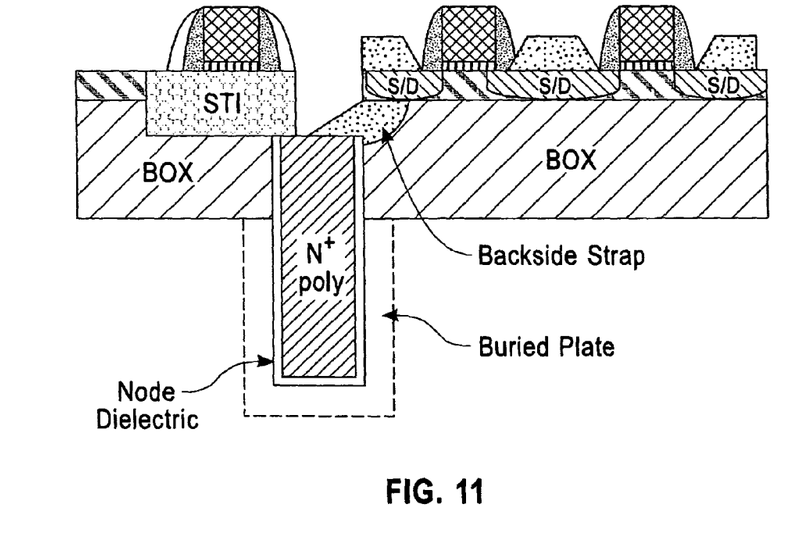

FIGS. 5-11 illustrate exemplary steps of fabricating the exemplary structure shown in FIG. 3. As shown in FIG. 5, start with a SOI wafer and form a deep trench with trench dielectric and poly fill. In FIG. 6, trench spacers are formed. In FIG. 7, an angled or tilted implant (e.g., with heavy ions) is performed to damage the nitride spacer on only one side of the trench. This damaged nitride is removed by an etch (e.g., a dry etch or a wet etch). In FIG. 8, the STI is formed. In FIG. 9, the devices (e.g., transistors) are fabricated. In FIG. 10, an oxide etch is performed which removes the STI in the area not protected (e.g., by a gate, dummy gate, mask). This etch undercuts the BOX under the pass transistor. In FIG. 11, a raised source/drain (RSD) epi is formed along with epi deposition of the backside strap. This connects the bottom of the transistor's S/D with the trench electrode. In some exemplary embodiments, silicide can be formed further to reduce the strap resistance (see FIGS. 3 and 4).

Figure 12:
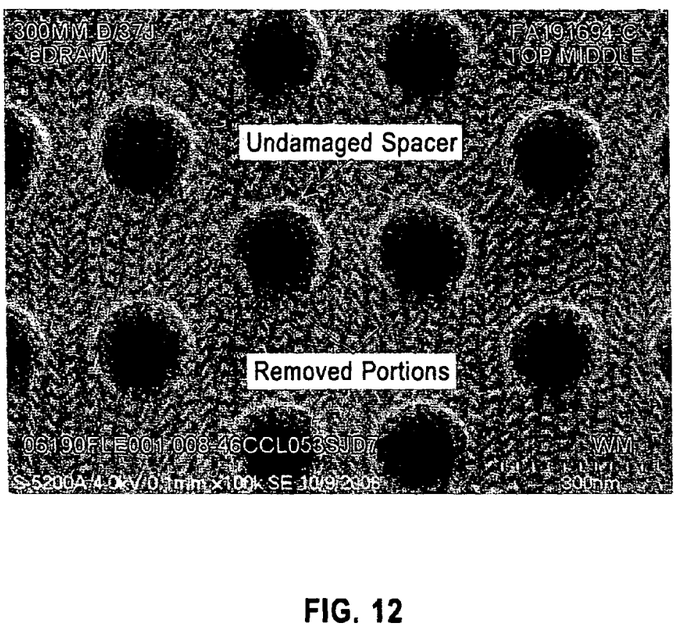
FIG. 12 shows a scanning electron microscope (SEM) top view of the structure shown in FIG. 7.

FIG. 12 shows a scanning electron microscope (SEM) top view of the structure shown in FIG. 7. The trenches in the SOI substrate are readily apparent. As identified in FIG. 12, each trench has a spacer within it and a portion of the spacer has been removed (e.g., using an angled implant to damage part of the spacer and an etch to remove the damaged portion).

To confine the backside strap to the desired undercut, a layer with good etch selectivity to oxide may be used in order to protect the BOX in other directions. As an example, and as described above, this can be the spacer material (e.g., a nitride) that is used in the trench capacitor formation.

One of ordinary skill in the art will appreciate the various techniques available to form the above-described structures.

In some exemplary embodiments of the invention the epitaxially deposited material matches the composition of the surface of the body. For example, if the body is essentially Si, the epitaxially deposited material may be essentially/primarily Si. As a further example, if there is a Ge content at the surface, the epitaxially deposited material may match that Ge content. In an alternative exemplary embodiment of the invention, the composition of the epitaxially deposited material is different from the composition of the surface of the body. For example, if the body is essentially/primarily Si, the epitaxially deposited material may be SiGe or Si:C. During the epitaxy process, the epi layer can be in-situ doped with one or more dopants such as phosphorus, arsenic, boron, and/or indium, as non-limiting examples. Alternatively, the epi layer can be ex-situ doped by performing a doping process after the epitaxy process. The doping techniques may include, but are not limited to: ion implantation, gas phase doping, plasma doping, plasma immersion ion implantation, cluster doping, infusion doping, liquid phase doping, and solid phase doping One or multiple cleaning processes may be performed before the epitaxy process to remove oxygen or other undesired material from the surface of the exposed semiconductor material in order to improve the epitaxy quality. The cleaning processes may include, but are not limited to: etching in a solution containing hydrofluoric acid and plasma etching with fluorine-containing species. As non-limiting examples, such fluorine-containing species include: ammonia (NH3), nitrogen trifluoride (NF3), ammonia fluoride (NH4F), ammonium hydrogen fluoride (NH4F.HF), and ammonium hexafluorosilicate ((NH4)2SiF6). In addition or in the alternative, a hydrogen prebake process may be performed after the above cleaning process and before the actual start of the epitaxy. For example, the semiconductor substrate may be heated at a temperature ranging from 700° C. to 950° C. in a hydrogen containing environment (e.g., for 10 to 200 seconds). This can be performed in the epitaxy chamber right before the epitaxy process to further clean the (exposed) semiconductor surface.

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

(1) In another exemplary embodiment, a semiconductor structure (e.g., a semiconductor device or a semiconductor apparatus) comprising: a silicon-on-insulator substrate comprised of a top silicon layer overlying an insulation layer, where the insulation layer overlies a bottom silicon layer; a capacitor disposed at least partially in the insulation layer; a device disposed at least partially on the top silicon layer, where the device is coupled to a doped portion of the top silicon layer; a backside strap comprised of first epitaxially-deposited material, where at least a first portion of the backside strap underlies the doped portion of the top silicon layer, where the backside strap is coupled to the doped portion of the top silicon layer at a first end of the backside strap and to the capacitor at a second end of the backside strap; and second epitaxially-deposited material that at least partially overlies the doped portion of the top silicon layer, where the second epitaxially-deposited material further at least partially overlies the first portion of the backside strap.

A semiconductor structure as above, where the backside strap is not in contact with the bottom silicon layer. A semiconductor structure as in any above, where the first portion of the backside strap is formed in an undercut region of the insulation layer underlying the top silicon layer. A semiconductor structure as in any above, where the second epitaxially-deposited material comprises a raised source/drain. A semiconductor structure as in any above, where the device comprises a transistor. A semiconductor structure as in any above, where the device comprises a pass transistor and the capacitor comprises a trench electrode, where the backside strap couples the pass transistor to the trench electrode. A semiconductor structure as in any above, where the semiconductor structure is embodied in a dynamic random-access memory cell.

A semiconductor structure as in any above, further comprising one or more aspects of the exemplary embodiments of the invention as described herein.

Figure 13:
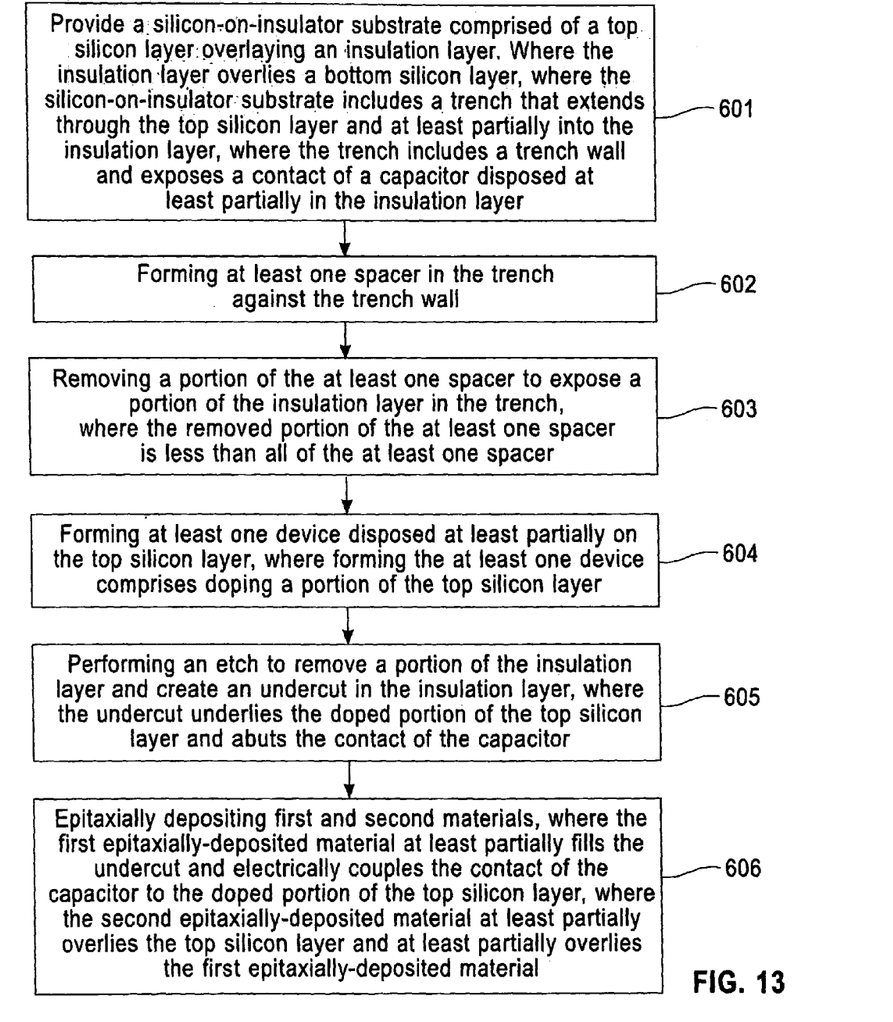
FIG. 13 depicts a flowchart illustrating one non-limiting example of a method for practicing the exemplary embodiments of this invention.

(2) In one exemplary embodiment, and as shown in FIG. 13, a method (e.g., to fabricate a semiconductor structure or semiconductor device having a backside strap) comprising: providing a silicon-on-insulator substrate comprised of a top silicon layer overlying an insulation layer, where the insulation layer overlies a bottom silicon layer, where the silicon-on-insulator substrate includes a trench that extends through the top silicon layer and at least partially into the insulation layer, where the trench includes a trench wall and exposes a contact of a capacitor disposed at least partially in the insulation layer (601); forming at least one spacer in the trench against the trench wall (602); removing a portion of the at least one spacer to expose a portion of the insulation layer in the trench, where the removed portion of the at least one spacer is less than all of the at least one spacer (603); forming at least one device disposed at least partially on the top silicon layer, where forming the at least one device comprises doping a portion of the top silicon layer (604); performing an etch to remove a portion of the insulation layer and create an undercut in the insulation layer, where the undercut underlies the doped portion of the top silicon layer and abuts the contact of the capacitor (605); and epitaxially depositing first and second materials, where the first epitaxially-deposited material at least partially fills the undercut and electrically couples the contact of the capacitor to the doped portion of the top silicon layer, where the second epitaxially-deposited material at least partially overlies the top silicon layer and at least partially overlies the first epitaxially-deposited material (606).

A method as above, where the capacitor is not coupled to the at least one device prior to epitaxially depositing the first epitaxially-deposited material and the second epitaxially-deposited material. A method as in any above, where epitaxially depositing the first and second materials is performed at the end of a front end of line process. A method as in any above, further comprising: forming silicide over at least the second epitaxially-deposited material. A method as in any above, where the first epitaxially-deposited material comprises a backside strap. A method as in any above, where the first epitaxially-deposited material comprises an in-situ doped semiconductor material. A method as in any above, where the second epitaxially-deposited material comprises a raised source/drain.

A method as in any above, where the at least one device comprises a transistor. A method as in any above, where epitaxially depositing the first and second materials is performed after providing the silicon-on-insulator substrate, forming the at least one spacer, removing the portion of the at least one spacer, forming the at least one device and performing the etch. A method as in any above, further comprising: after performing the etch, removing any remaining portions of the at least one spacer. A method as in any above, where at least one of the first epitaxially-deposited material and the second epitaxially-deposited material comprises Silicon Germanium or Silicon Carbon. A method as in any above, further comprising: after epitaxially depositing the first and second materials, performing a doping process to dope at least the second epitaxially-deposited material. A method as in any above, where at least one of the first epitaxially-deposited material and the second epitaxially-deposited material is in-situ doped with at least one dopant during the epitaxial deposition of at least one of the first and second materials. A method as in any above, further comprising: performing at least one cleaning process prior to epitaxially depositing the first and second materials, where the at least one cleaning process removes undesired material from a surface of the exposed portion of the insulation layer in order to improve epitaxy quality.

A method as in any above, further comprising one or more aspects of the exemplary embodiments of the invention as described herein.

A semiconductor structure formed in accordance with any of the above methods (i.e., one or more of the above-described methods).

Figure 14:
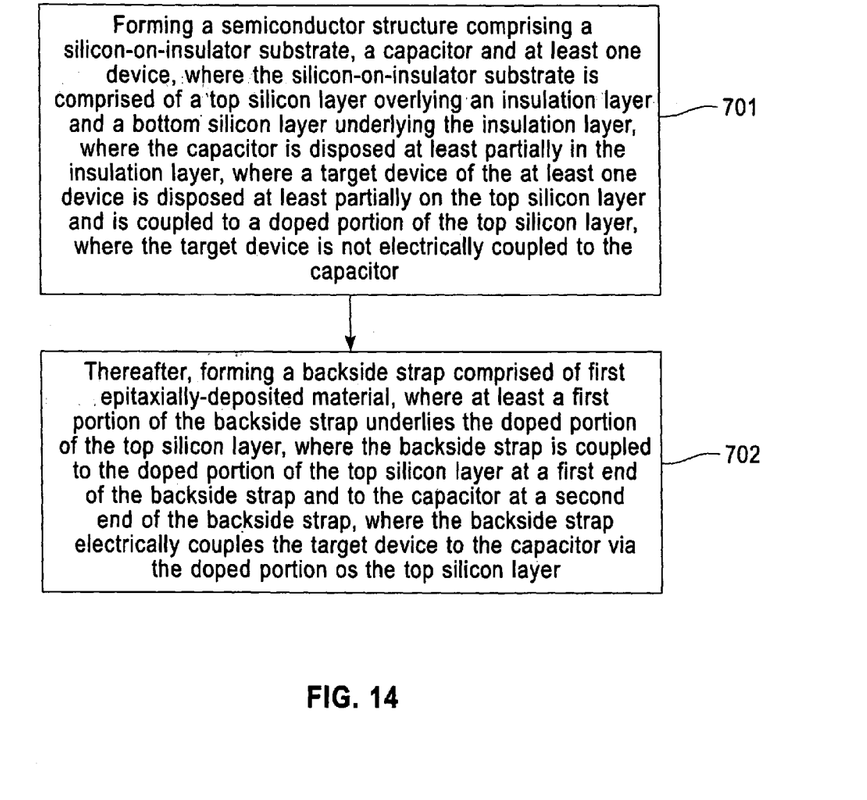
FIG. 14 depicts a flowchart illustrating another non-limiting example of a method for practicing the exemplary embodiments of this invention

(3) In one exemplary embodiment, and as shown in FIG. 14, a method comprising: forming a semiconductor structure comprising a silicon-on-insulator substrate, a capacitor and at least one device, where the silicon-on-insulator substrate is comprised of a top silicon layer overlying an insulation layer and a bottom silicon layer underlying the insulation layer, where the capacitor is disposed at least partially in the insulation layer, where a target device of the at least one device is disposed at least partially on the top silicon layer and is coupled to a doped portion of the top silicon layer, where the target device is not electrically coupled to the capacitor (701); and thereafter, forming a backside strap comprised of first epitaxially-deposited material, where at least a first portion of the backside strap underlies the doped portion of the top silicon layer, where the backside strap is coupled to the doped portion of the top silicon layer at a first end of the backside strap and to the capacitor at a second end of the backside strap, where the backside strap electrically couples the target device to the capacitor via the doped portion of the top silicon layer (702).

A method as above, where forming the semiconductor structure further comprises performing a shallow trench isolation. A method as in any above, where forming the backside strap comprises: performing an etch to remove a portion of the insulation layer and create an undercut in the insulation layer, where the undercut underlies the doped portion of the top silicon layer and abuts the capacitor; and epitaxially depositing the first epitaxially-deposited material to at least partially fill the undercut and electrically couple the capacitor to the doped portion of the top silicon layer. A method as in any above, where forming the backside strap is performed after other front end of line processes. A method as in any above, further comprising: forming a raised source/drain comprised of second epitaxially-deposited material, where the raised source/drain at least partially overlies the doped portion of the top silicon layer. A method as in any above, where at least one of the first epitaxially-deposited material and the second epitaxially-deposited material is in-situ doped with at least one dopant during at least one epitaxial deposition.

A method as in any above, further comprising one or more aspects of the exemplary embodiments of the invention as described herein.

A semiconductor structure formed in accordance with any of the above methods (i.e., one or more of the above-described methods).

The blocks shown in FIGS. 13 and 14 further may be considered to correspond to one or more functions and/or operations that are performed by one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIGS. 13 and 14 should be considered merely exemplary and non-limiting. It should be appreciated that the blocks shown in FIGS. 13 and 14 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIGS. 13 and 14 so as to implement one or more further exemplary embodiments of the invention.

That is, the exemplary embodiments of the invention shown in FIGS. 13 and 14 may be utilized, implemented or practiced in conjunction with one or more further aspects in any combination (e.g., any combination that is suitable, practicable and/or feasible) and are not limited only to the steps, blocks, operations and/or functions shown in FIGS. 13 and 14.

The flowchart and block diagrams in FIGS. 3-14 illustrate the architecture, functionality, and operation of possible exemplary implementations of systems, methods and products according to various exemplary embodiments of the invention. In this regard, each block in the flowchart or block diagrams may represent a module, segment or portion of code, which comprises one or more executable instructions for implementing the specified (logical) function(s). It should also be noted that, in some alternative exemplary implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

The terminology used herein is for the purpose of describing particular exemplary embodiments only and is not intended to be limiting of the exemplary embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Unless described otherwise herein, "depositing" may include any now known or later developed techniques appropriate for the material to be deposited, including, but not limited to: chemical vapor deposition (CVD), low-pressure CVD (LPCVD), plasma-enhanced CVD (PECVD), semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly," "polysilicon" or "poly Si" should be understood to refer to polycrystalline silicon.

While described herein in relation to a layer of BOX, the exemplary embodiments are not limited thereto and may be used in conjunction any suitable layer of insulating material. Furthermore, while described herein in relation to one or more transistors, the exemplary embodiments are not limited thereto and may be used in conjunction any suitable electronic device or structure.

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method comprising:
providing a silicon-on-insulator substrate comprised of a top silicon layer overlying an insulation layer, where the insulation layer overlies a bottom silicon layer, where the silicon-on-insulator substrate includes a trench that extends through the top silicon layer and at least partially into the insulation layer, where the trench includes a trench wall and exposes a contact of a capacitor disposed at least partially in the insulation layer;
forming at least one spacer in the trench against the trench wall;
removing a portion of the at least one spacer to expose a portion of the insulation layer in the trench, where the removed portion of the at least one spacer is less than all of the at least one spacer;
forming at least one device disposed at least partially on the top silicon layer, where forming the at least one device comprises doping a portion of the top silicon layer;
performing an etch to remove a portion of the insulation layer and create an undercut in the insulation layer, where the undercut underlies the doped portion of the top silicon layer and abuts the contact of the capacitor; and
epitaxially depositing first and second materials, where the first epitaxially-deposited material at least partially fills the undercut and electrically couples the contact of the capacitor to the doped portion of the top silicon layer, where the second epitaxially-deposited material at least partially overlies the top silicon layer and at least partially overlies the first epitaxially-deposited material.

2. The method of claim 1, where the capacitor is not coupled to the at least one device prior to epitaxially depositing the first epitaxially-deposited material and the second epitaxially-deposited material.

3. The method of claim 1, where epitaxially depositing the first and second materials is performed after providing the silicon-on-insulator substrate, forming the at least one spacer, removing the portion of the at least one spacer, forming the at least one device and performing the etch.

4. The method of claim 1, where at least one of the first epitaxially-deposited material and the second epitaxially-deposited material is in-situ doped with at least one dopant during the epitaxial deposition of at least one of the first and second materials.

5. The method of claim 1, further comprising: after performing the etch, removing any remaining portions of the at least one spacer.

6. The method of claim 1, where epitaxially depositing the first and second materials is performed at the end of a front end of line process.

7. The method of claim 1, further comprising: performing a shallow trench isolation.

8. The method of claim 1, further comprising: forming a raised source/drain comprised of second epitaxially-deposited material, where the raised source/drain at least partially overlies the doped portion of the top silicon layer.

9. The method of claim 1, further comprising: forming silicide over at least the second epitaxially-deposited material.

10. The method of claim 1, where the first epitaxially-deposited material comprises an in-situ doped semiconductor material.

11. The method of claim 1, where the second epitaxially-deposited material comprises a raised source/drain.

12. The method of claim 1, where the at least one device comprises a transistor.

13. The method of claim 1, where at least one of the first epitaxially-deposited material and the second epitaxially-deposited material comprises Silicon Germanium or Silicon Carbon.

14. The method of claim 1, further comprising: after epitaxially depositing the first and second materials, performing a doping process to dope at least the second epitaxially-deposited material.

15. The method of claim 1, further comprising: performing at least one cleaning process prior to epitaxially depositing the first and second materials, where the at least one cleaning process removes undesired material from a surface of the exposed portion of the insulation layer in order to improve epitaxy quality.

16. The method of claim 1, where the first epitaxially-deposited material comprises a backside strap.

17. The method of claim 16, where the backside strap is not in contact with the bottom silicon layer.

18. The method of claim 16, where the at least one device comprises a pass transistor and the capacitor comprises a trench electrode, where the backside strap couples the pass transistor to the trench electrode.

19. The method of claim 1, where the method is for forming a semiconductor structure, where the semiconductor structure is embodied in a dynamic random-access memory cell.

* * * * *